US009786360B2

(12) United States Patent
Koike

(10) Patent No.: US 9,786,360 B2
(45) Date of Patent: Oct. 10, 2017

(54) STATIC SEMICONDUCTOR MEMORY DEVICE USING A SINGLE GLOBAL DATA LINE

(71) Applicant: SOCIONEXT INC., Kanagawa (JP)

(72) Inventor: Tsuyoshi Koike, Shiga (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/162,321

(22) Filed: May 23, 2016

(65) Prior Publication Data

US 2016/0267963 A1 Sep. 15, 2016

Related U.S. Application Data

(63) Continuation of application No. PCT/JP2014/005056, filed on Oct. 3, 2014.

(30) Foreign Application Priority Data

Nov. 27, 2013 (JP) .................................. 2013-244576

(51) Int. Cl.
*G11C 11/419* (2006.01)
*G11C 7/12* (2006.01)

(52) U.S. Cl.
CPC .............. *G11C 11/419* (2013.01); *G11C 7/12* (2013.01)

(58) Field of Classification Search
CPC ......... G11C 11/419; G11C 7/12; G11C 7/065; G11C 11/413; G11C 2207/002; G11C 2207/005
See application file for complete search history.

(56) References Cited

U.S. PATENT DOCUMENTS

2003/0031044 A1* 2/2003 Higeta .................. G11C 11/417
365/156
2004/0202014 A1* 10/2004 Palmer .................. G11C 11/419
365/154

(Continued)

FOREIGN PATENT DOCUMENTS

| JP | 2000-207886 A | 7/2000 |
| JP | 2008-177360 A | 7/2008 |

(Continued)

OTHER PUBLICATIONS

International Search Report and Written Opinion issued in corresponding International Patent Application No. PCT/JP2014/005056, mailed on Dec. 2, 2014; with partial English translation.

*Primary Examiner* — Pho M Luu
*Assistant Examiner* — Jerome Leboeuf
(74) *Attorney, Agent, or Firm* — McDermott Will & Emery LLP

(57) ABSTRACT

A memory bank of a semiconductor memory device includes: a plurality of memory cells; first and second local bit lines; a differential amplifier configured to amplify a potential difference between the first and second local bit lines; a connector to which a global data line is connected; a first output circuit configured to selectively output, according to a potential level of the first local bit line, a first potential to the connector; and a second output circuit configured to selectively prevent, according to a potential level of the second local bit line, a potential of the connector from being affected by an output of the first output circuit and being equal to the first potential.

5 Claims, 10 Drawing Sheets

(56) References Cited

U.S. PATENT DOCUMENTS

| | | | |
|---|---|---|---|
| 2005/0146975 A1* | 7/2005 | Halbert | G11C 7/1012 365/230.03 |
| 2008/0002497 A1* | 1/2008 | Barth, Jr. | G11C 7/12 365/205 |
| 2008/0175040 A1 | 7/2008 | Kushida et al. | |
| 2009/0161411 A1 | 6/2009 | Kushida | |
| 2013/0083592 A1 | 4/2013 | Kang et al. | |
| 2013/0176795 A1* | 7/2013 | Dengler | G11C 7/12 365/189.05 |
| 2014/0036581 A1* | 2/2014 | Agarwal | G11C 7/065 365/156 |
| 2014/0112064 A1* | 4/2014 | Adams | G11C 7/12 365/154 |

FOREIGN PATENT DOCUMENTS

| | | |
|---|---|---|
| JP | 2009-157959 A | 7/2009 |
| JP | 2012-174329 A | 9/2012 |

* cited by examiner

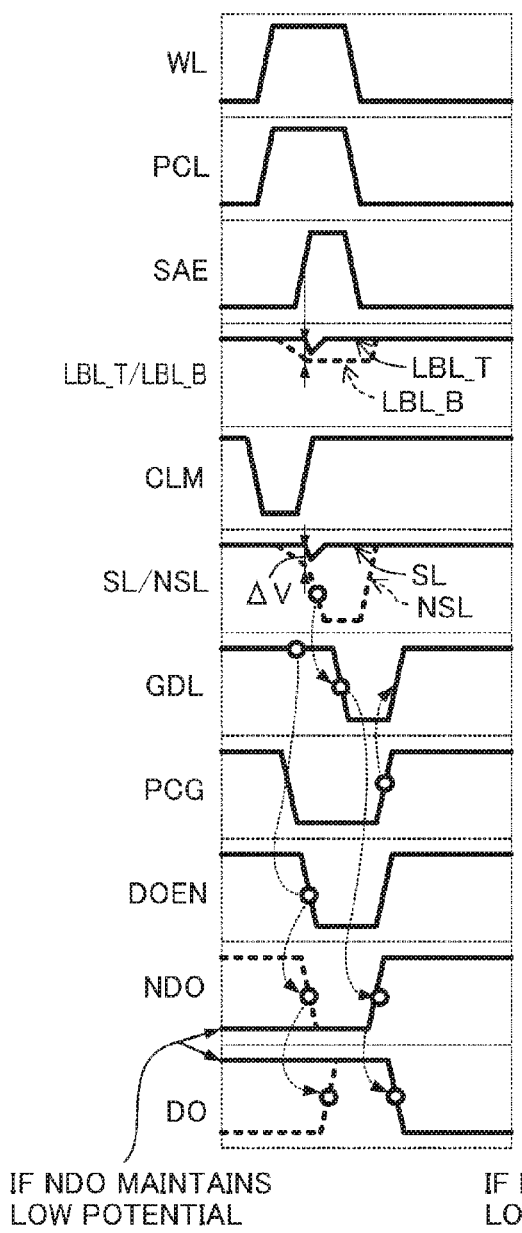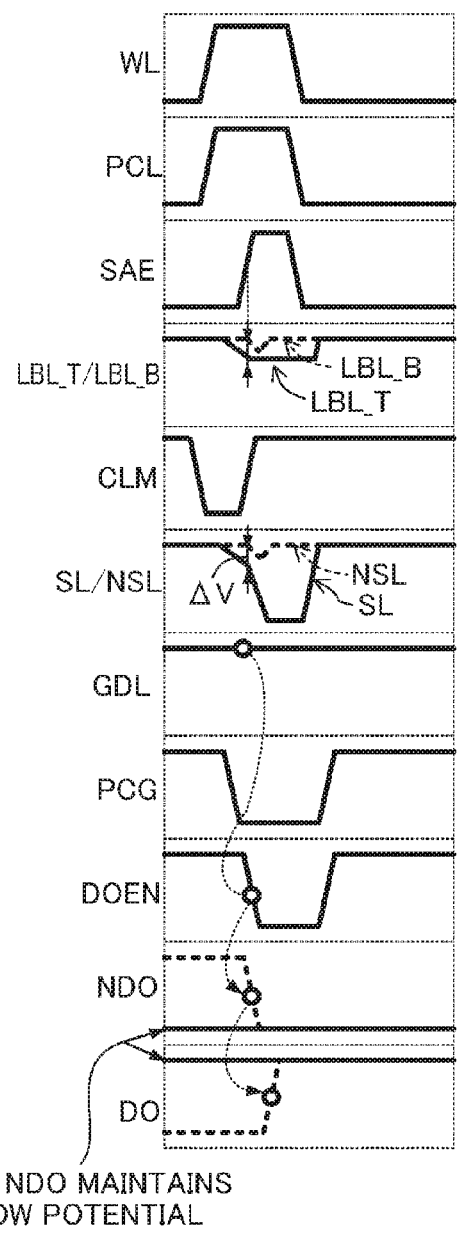

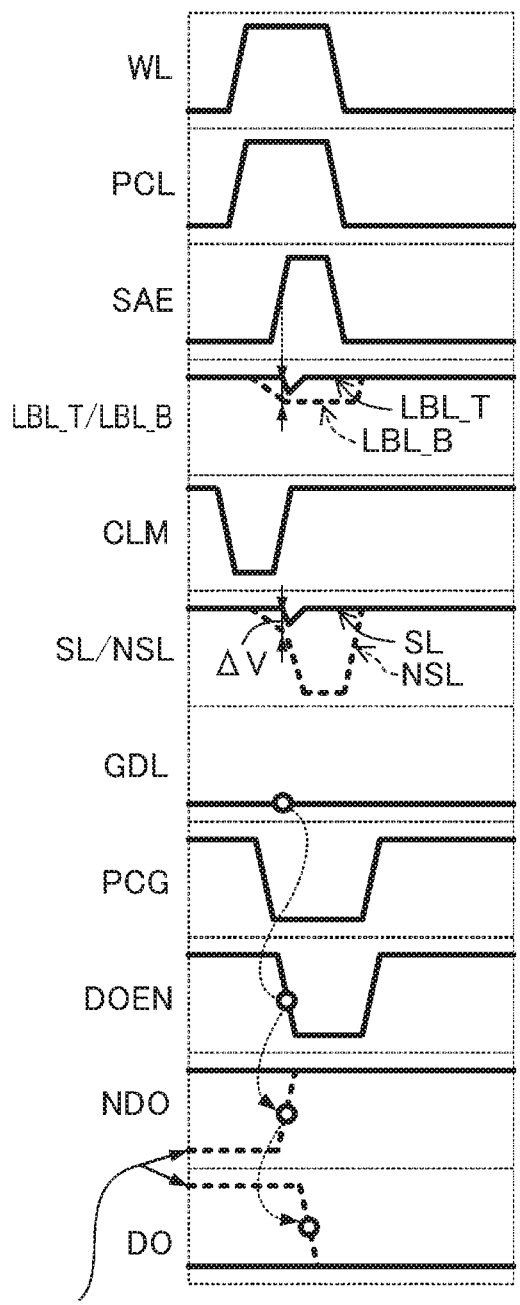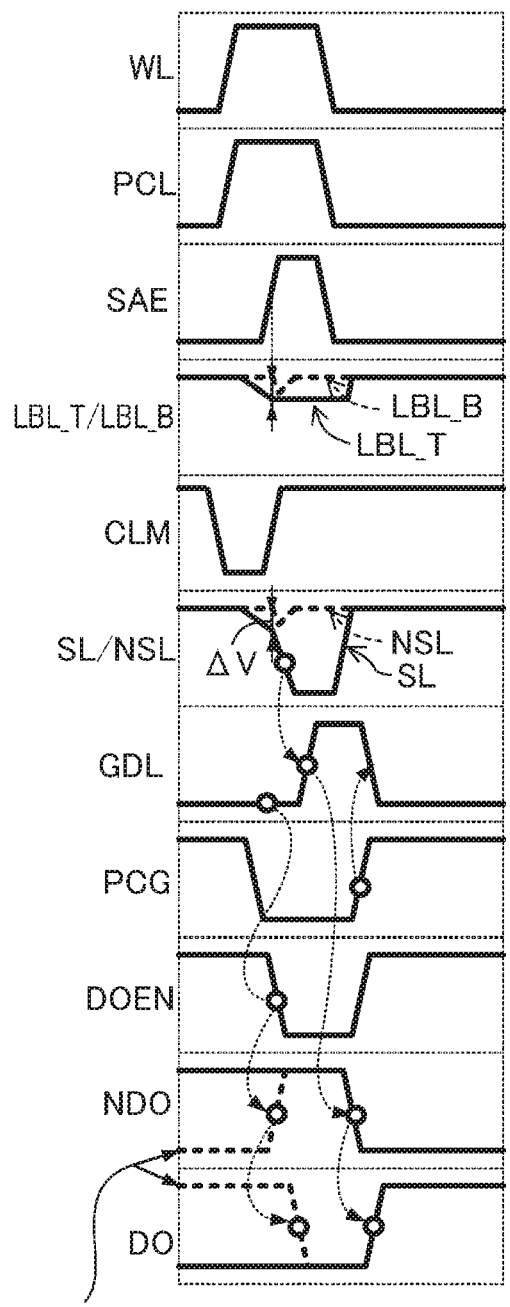

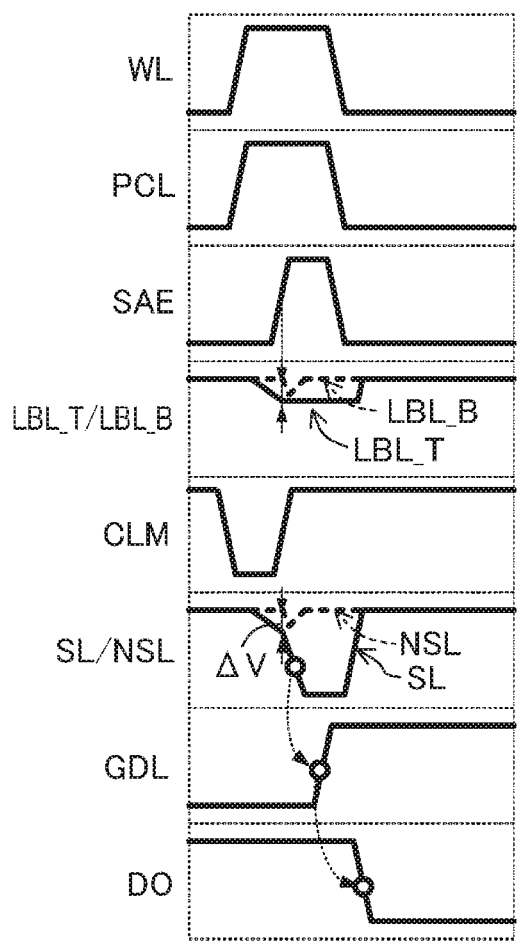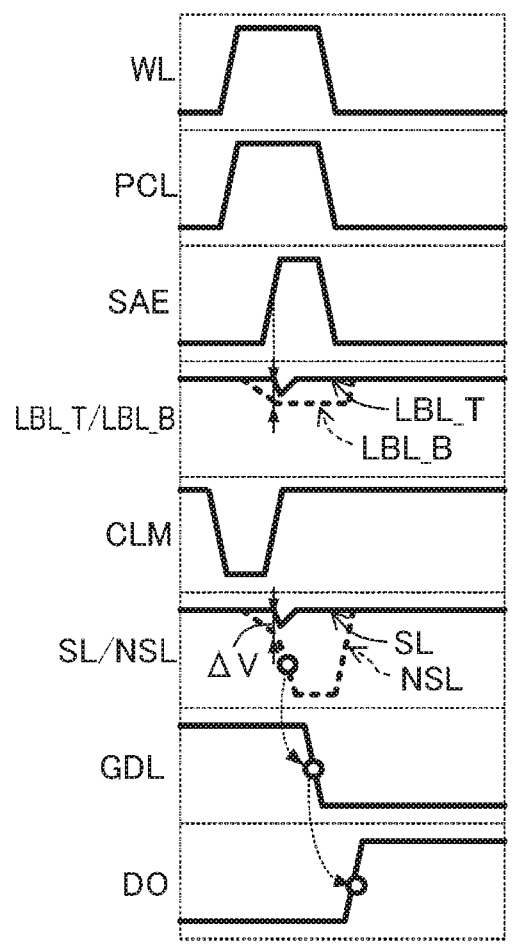

STATIC SEMICONDUCTOR MEMORY DEVICE USING A SINGLE GLOBAL DATA LINE

CROSS-REFERENCE TO RELATED APPLICATION

This is a continuation of International Application No. PCT/JP2014/005056 filed on Oct. 3, 2014, which claims priority to Japanese Patent Application No. 2013-244576 filed on Nov. 27, 2013. The entire disclosures of these applications are hereby incorporated by reference.

BACKGROUND

The present disclosure relates to a semiconductor memory device, and more particularly relates to a semiconductor memory device in which bit lines have a hierarchical structure.

Nowadays, memories built in systems on chip (SOCs) have their storage capacity further increased to have even higher operating speeds. As the storage capacity of those memories is increased, however, the number of memory cells to be connected to a single bit line also needs to be increased, which imposes a heavier and heavier load capacity on each bit line, thus inhibiting the memory cells from further increasing their operating speeds as required. Thus, a hierarchical bit line structure has been proposed as a known technique for cutting down the bit line capacity (see, for example, Japanese Patent No. 5019579). In the hierarchical bit line structure, bit lines are divided into multiple groups to be assigned to a plurality of memory banks, and memory cells in each of those memory banks are connected to a pair of local bit lines, which are further connected to a global bit line with the potential difference between the two bit lines amplified by a differential amplifier.

As another example using such a hierarchical bit line structure, a semiconductor memory device configured to read data using a single global bit line is disclosed in, for example, Japanese Patent No. 5178182. In this semiconductor memory device, one of the two outputs of a differential amplifier is connected to an inverter, the output of which is connected to the gate of a transistor that is connected between the global bit line and the ground, and data is read by sensing a variation in the potential of the global bit line. This semiconductor memory device needs a smaller number of global bit lines, and therefore, may reduce the amount of leakage current to flow and cut down the overall circuit area on the chip.

The semiconductor memory device disclosed in Japanese Patent No. 5178182, however, has the following drawbacks. Specifically, in general, when the potential difference between a pair of local bit lines is amplified by a differential amplifier, one of the two bit lines that has the higher potential is induced to have its potential somewhat lowered toward the Low potential level. As a result, the output level of the inverter that should be Low is raised to a High potential level to turn the transistor ON unintentionally. Thus, data may be read erroneously on the global bit line. Particularly if the inverter has varying threshold values such that the level of its input is easily determined to be Low or if there is little potential difference between the pair of bit lines, there are higher chances of the storage device operating erroneously.

In addition, while data is going to be read using a single global bit line, the global bit line may be precharged to the High level, for example, during the read operation, and a potential level of the global bit line is determined by an output circuit at an arbitrary point in time. In this case, if the potential of the global bit line has decreased to a lower level, the drivability of the output circuit may deteriorate too much to have the output data reset normally by the output circuit.

Furthermore, when a read operation is performed, the global bit line is no longer precharged, and therefore, becomes floating. In this case, if a plurality of memory banks are connected to the global bit line, then a plurality of transistors are connected to the global bit line. Thus, the global bit line that should have the High potential level is discharged due to the leakage current flowing from those transistors. As a result, the storage device may operate erroneously.

Moreover, since an inverter is connected to one of each pair of local bit lines, the load capacities of respective connection nodes between the pair of local bit lines and the differential amplifier are so imbalanced that the differential amplifier tends to operate erroneously, which is another concern about the conventional storage device.

In view of the foregoing background, the present disclosure provides a technique for reducing the chances of the differential amplifier and the semiconductor memory device operating erroneously.

SUMMARY

To overcome the problem, the present disclosure provides the following solutions. Specifically, a semiconductor memory device according to a first aspect of the present disclosure includes: a plurality of memory banks; and a single global data line provided for the plurality of memory banks. Each of the plurality of memory banks includes: a plurality of memory cells; first and second local bit lines forming a pair of local bit lines, to which the plurality of memory cells are connected and through which data is read from the plurality of memory cells; a differential amplifier configured to amplify a potential difference between the first and second local bit lines; a connector to which the global data line is connected; a first output circuit configured to selectively output, according to a potential level of the first local bit line, a first potential to the connector; and a second output circuit configured to selectively prevent, according to a potential level of the second local bit line, a potential of the connector from being affected by an output of the first output circuit and being equal to the first potential.

According to this configuration, a plurality of memory banks are connected to a single global data line. The data that has been read from a plurality of memory cells included in any of the memory banks to first and second local bit lines, forming a pair of local bit lines, is amplified by a differential amplifier. A first output circuit selectively outputs, according to the potential level of the first local bit line, a first potential to a connector. A second output circuit performs control so as to selectively prevent, according to a potential level of a second local bit line, a potential of the connector from being affected by an output of the first output circuit and being equal to the first potential.

For example, while the semiconductor memory device is performing a read operation, the first output circuit is supposed to output a Low potential as the first potential to the connector if the potential level of the first local bit line is Low, but stop outputting the potential if the potential level of the first local bit line is High. On the other hand, the second output circuit is supposed to prevent the potential of the connector from going Low if the potential level of the second local bit line is Low. Also, while the semiconductor memory device is performing a read operation, the global data line is supposed to be precharged to the High potential level. Furthermore, if the data in a memory cell is High, then the global data line has the High potential. On the other hand, if the data in a memory cell is Low, then the global data line has the Low potential.

Data in High state may be read from an arbitrary memory cell if the first local bit line is driven High and if the second local bit line is driven Low, for example. In that case, when the potential difference between the first and second local bit lines is amplified by the differential amplifier, the first local bit line having the High potential is discharged by the differential amplifier through its peculiar both-bits simultaneous discharge operation. As a result, the first output circuit outputs a Low potential to the connector.

However, since the second local bit line currently has the Low potential, the second output circuit performs control so as to prevent the connector from having the Low potential. Thus, the global data line keeps the High potential level, and therefore, data in High state is output.

As can be seen, when the global data line should have the High potential, the semiconductor memory device of the present disclosure may maintain the global data line at the normal High potential level. That is to say, no data will be read erroneously onto the global data line. In addition, since the global data line may be maintained at the normal High potential level, an I/O (input/output) circuit, for example, is allowed to reset the output data properly. On top of that, by connecting the first and second output circuits to the first and second local bit lines, respectively, the load capacities of respective connection nodes between the differential amplifier and the local bit lines may be balanced more easily. As a result, the chances of the differential amplifier operating erroneously may be reduced.

As can be seen from the foregoing description, a semiconductor memory device that is much less likely to operate erroneously with the sensitivity of the differential amplifier kept sufficiently high may be provided according to the present disclosure.

A semiconductor memory device according to a second aspect of the present disclosure includes: a plurality of memory banks; and a single global data line provided for the plurality of memory banks. Each of the plurality of memory banks includes: a plurality of memory cells; first and second local bit lines forming a pair of local bit lines, to which the plurality of memory cells are connected and through which data is read from the plurality of memory cells; a differential amplifier configured to amplify a potential difference between the first and second local bit lines; a connector to which the global data line is connected; a first output circuit configured to selectively output, according to a potential level of the first local bit line, a first potential to the connector; and a second output circuit configured to selectively output, according to a potential level of the second local bit line, a second potential that is the inverse of the first potential to the connector.

In the semiconductor memory device according to the second aspect, the second output circuit has a different configuration from its counterpart of the semiconductor memory device according to the first aspect. Thus, this difference will be described briefly. The second output circuit selectively outputs a second potential, which is the inverse of the potential output by the first output circuit, to the connector according to the potential level of the second local bit line. For example, if the second local bit line has a Low potential, then the second output circuit outputs a High potential to the connector.

While a semiconductor memory device according to this second aspect is reading data in High state, the potential difference between the first local bit line with the High potential and the second local bit line with the Low potential is amplified by the differential amplifier, when the first local bit line is discharged. In this case, if the first output circuit outputs a Low potential to the connector, the second output circuit outputs a High potential to the connector.

Thus, the connector may be maintained at the High potential level, and therefore, the global data line that has been precharged to the High potential level may be maintained at the normal High potential level. Furthermore, even if any transistor connected to the global data line causes leakage current, for example, the second output circuit may output a High potential to the connector. Thus, the global data line may be prevented from having its potential level lowered by the leakage current.

The semiconductor memory device according to the second aspect achieves the same advantages as the device according to the first aspect in the other respects as well.

Optionally, in the semiconductor memory device according to the second aspect, the global data line may be intentionally driven High or Low by output from the first and second output circuits to the connector. Then, there is no need to precharge the global data line.

For example, while data in High state is going to be read, the first output circuit outputs a Low potential to the connector in accordance with the potential level of the first local bit line currently having the Low potential. On the other hand, the second output circuit stops outputting the potential in accordance with the potential level of the second local bit line currently having the High potential. As a result, the global data line comes to have a Low potential, and therefore, data in High state may be output by the I/O circuit, for example.

According to the present disclosure, the chances of the differential amplifier and semiconductor memory device operating erroneously may be reduced.

BRIEF DESCRIPTION OF THE DRAWINGS

FIGS. 2A and 2B show timing charts illustrating how the semiconductor memory device shown in FIG. 1 may perform a read operation in an exemplary embodiment.

FIGS. 5A and 5B show timing charts illustrating how the semiconductor memory device shown in FIG. 4 may perform a read operation in an exemplary embodiment.

FIGS. 7A and 7B show timing charts illustrating how the semiconductor memory device shown in FIG. 6 may perform a read operation in an exemplary embodiment.

DETAILED DESCRIPTION

First Embodiment

Figure 1:
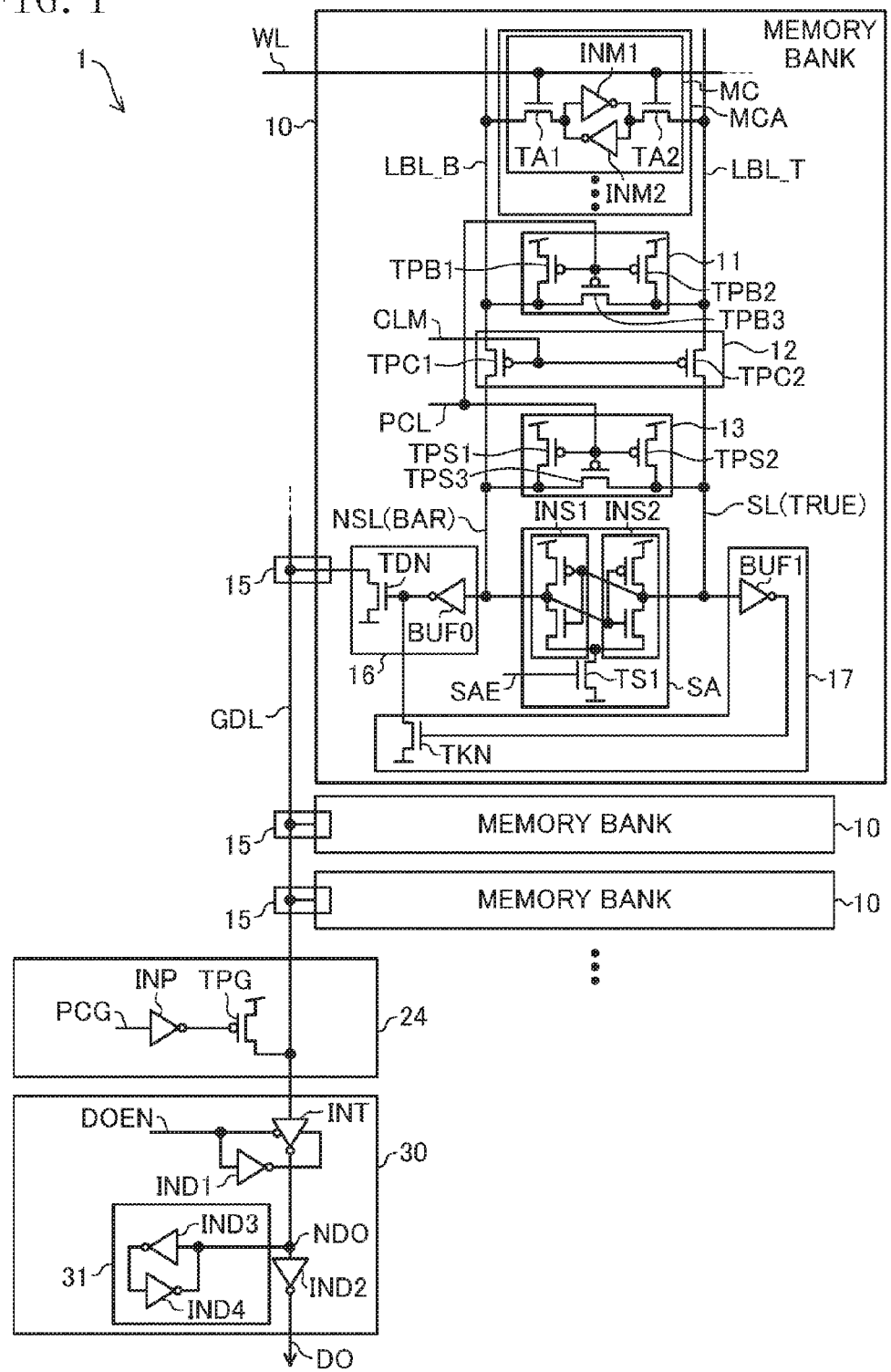
FIG. 1 illustrates a configuration for a semiconductor memory device according to a first embodiment.

FIG. 1 illustrates a configuration for a semiconductor memory device according to a first embodiment. A semiconductor memory device 1 according to this embodiment has a hierarchical bit line structure, and is configured to read data using a global data line GDL having a single-ended configuration. Specifically, the semiconductor memory device 1 includes a plurality of memory banks 10, a single global data line GDL, a global precharge circuit 24, and an I/O circuit 30.

Each of the memory banks 10 includes: a memory cell array MCA including a plurality of memory cells MC arranged in columns and rows; a word line WL; a pair of local bit lines LBL_B, LBL_T; a bit line precharge circuit 11; a column selector 12; a pair of sense lines NSL, SL; a sense line precharge circuit 13; a differential amplifier SA; a connector 15; and first and second output circuits 16, 17.

Each of the memory cells MC may be configured as a static random access memory (SRAM), for example, and includes two access transistors TA1, TA2 and two inverters INM1, INM2 that form a latch.

The transistor TA1 is an Nch transistor, and has one terminal thereof connected to a local bit line LBL_B functioning as a first local bit line, another terminal thereof connected to the inverters INM1, INM2, and a gate thereof connected to an associated word line WL. The transistor TA2 is an Nch transistor, and has one terminal thereof connected to a local bit line LBL_T functioning as a second local bit line, another terminal thereof connected to the inverters INM1, INM2, and a gate thereof connected to the associated word line WL. The word line WL is provided for a plurality of memory cells MC arranged in a row direction.

The bit line precharge circuit 11 may include three Pch transistors TPB1-TPB3, for example. The transistor TPB1 has one terminal thereof connected to a voltage VDD which may be a power supply potential, for example, and another terminal thereof connected to the local bit line LBL_B. The transistor TPB2 has one terminal thereof connected to the voltage VDD and another terminal thereof connected to the local bit line LBL_T. The transistor TPB3 is connected between the pair of local bit lines LBL_B, LBL_T. A local precharge signal PCL is input in common to the respective gates of these three transistors TPB1-TPB3.

The column selector 12 includes two Pch transistors TPC1, TPC2. The transistor TPC1 is connected between the local bit line LBL_B and the sense line NSL. The transistor TPC2 is connected between the local bit line LBL_T and the sense line SL. A column select signal CLM is input in common to the respective gates of these two transistors TPC1, TPC2.

The sense line precharge circuit 13 may include three Pch transistors TPS1-TPS3, for example. The transistor TPS1 has one terminal thereof connected to the voltage VDD and another terminal thereof connected to the sense line NSL corresponding to the first local bit line. The transistor TPS2 has one terminal thereof connected to the voltage VDD and another terminal thereof connected to the sense line SL corresponding to the second local bit line. The transistor TPS3 is connected between the pair of sense lines NSL, SL. The signal PCL is input in common to the respective gates of these three transistors TPS1-TPS3.

Note that if the memory cell MC is located at a short distance from the differential amplifier SA, the column selector 12 and the sense line precharge circuit 13 may be omitted. That is to say, in that case, the memory cell MC and the differential amplifier SA may be connected together via the pair of local bit lines LBL_B, LBL_T (or the pair of sense lines NSL, SL).

The differential amplifier SA amplifies the potential difference between the local bit lines LBL_B, LBL_T in response to a sense amplifier activating signal SAE. Specifically, the differential amplifier SA includes cross-coupled inverters INS1, INS2 and an Nch transistor TS1. Each of the inverters INS1, INS2 is connected between the voltage VDD and the transistor TS1. The transistor TS1 is connected between the inverters INS1, INS2 and the voltage VSS which may be a ground potential, for example, and receives the signal SAE at its gate.

The connector 15 connects the memory bank 10 and the global data line GDL together. The connector 15 may be a terminal, a line, or any other member as long as the connector 15 electrically connects the memory bank 10 and the global data line GDL together.

The first output circuit 16 is configured to selectively output a first potential (such as the voltage VSS) having Low level as a first type of logic to the connector 15 according to the potential level of the sense line NSL. Specifically, the output circuit 16 includes a buffer BUF0, which may be configured as an inverter, for example, and an Nch transistor TDN. The buffer BUF0 has its input terminal connected to the sense line NSL and its output terminal connected to the gate of the transistor TDN. The transistor TDN has one terminal thereof connected to the voltage VSS and another terminal thereof connected to the connector 15.

As can be seen, according to this embodiment, the output circuit 16 is configured to output a Low potential to the connector 15 if the sense line NSL has the Low potential, but to stop outputting the potential if the sense line NSL has a High potential.

The second output circuit 17 selectively operates according to the potential level of the sense line SL. The output circuit 17 includes a buffer BUF1, which may be configured as an inverter, for example, and an Nch transistor TKN. The buffer BUF1 has its input terminal connected to the sense line SL and its output terminal connected to the gate of the transistor TKN. The transistor TKN has one terminal thereof connected to the gate of the transistor TDN and another terminal thereof connected to the voltage VSS. By adopting such a configuration, the output circuit 17 is allowed to selectively prevent, according to the potential level of the sense line SL, the connector 15 from being affected by the output of the output circuit 16 and having the Low potential.

As can be seen, the output circuit 17 according to this embodiment is configured to output a Low potential to the gate of the transistor TDN if the sense line SL has the Low potential, but stop outputting the potential if the sense line SL has a High potential. That is to say, the output circuit 17 performs control so as to prevent the connector 15 from having the Low potential with the transistor TDN turned OFF by outputting the Low potential to the gate of the transistor TDN of the output circuit 16 if the sense line SL has the Low potential.

The global precharge circuit 24 includes an inverter INP and a Pch transistor TPG. The inverter INP receives a global precharge signal PCG, inverts the signal PCG, and outputs the inverted signal to the gate of the transistor TPG. The transistor TPG has one terminal thereof connected to the voltage VDD and another terminal thereof connected to the global data line GDL. The global precharge circuit 24 may be configured to selectively precharge the global data line GDL to the High potential level in response to the signal PCG.

The I/O circuit 30 selectively outputs a signal DO as output data according to the potential level of the global data line GDL. The I/O circuit 30 may include a tristate inverter INT, inverters IND1, IND2, and a latch circuit 31, for example.

The tristate inverter INT selectively operates in response to an output enable signal DOEN, inverts the potential of the global data line GDL, and outputs the inverted potential to a node NDO.

The inverter IND1 inverts the signal DOEN and outputs the inverted signal. The inverter IND2 inverts the potential of the node NDO and outputs a signal DO.

The latch circuit 31 includes inverters IND3, IND4, and is connected to the node NDO.

Note that the configuration of the I/O circuit 30 described above is just an example. Rather, the I/O circuit 30 may have any other configuration as long as the I/O circuit 30 is able to determine the potential level of the global data line GDL and output the signal DO indicating a result of the determination.

As can be seen from the foregoing description, a semiconductor memory device 1 according to this embodiment has a configuration in which a plurality of memory banks 10 are connected to the global data line GDL having such a single-ended configuration.

Next, it will be described with reference to FIG. 2 how the semiconductor memory device 1 according to this embodiment may perform a read operation.

FIG. 2 shows timing charts illustrating how the semiconductor memory device shown in FIG. 1 may perform a read operation in an exemplary embodiment. FIG. 2A illustrates how the device operates in reading data in Low state, and FIG. 2B illustrates how the device operates in reading data in High state.

When a read operation is started, the signal PCL is Low, and the local bit lines LBL_B, LBL_T and the sense lines NSL, SL have been precharged to the High potential level. Thus, the transistors TDN, TKN are both OFF and the output of the output circuits 16, 17 has been stopped.

Meanwhile, the signal PCG is High, and the global data line GDL has been precharged to the High potential level. The word line WL and the signal SAE are Low, and the signals CLM and DOEN are High.

First, the operation of reading data in Low state as shown in FIG. 2A will be described. When a target memory cell MC to read data from is specified by an address signal (not shown), the word line WL and the signal PCL go High, and the signals CLM and PCG go Low.

As a result, the local bit lines LBL_B, LBL_T and the sense lines NSL, SL stop being precharged, and the local bit line LBL_B is induced to have a potential gradually falling toward the Low potential level. Meanwhile, the global data line GDL is floating.

Then, the potential of the local bit lines LBL_B, LBL_T is transferred to the sense lines NSL, SL via the column selector 12. Next, the signal SAE goes High, thus driving the differential amplifier SA. At the same time, the signal CLM also goes High to turn the column selector 12 OFF, while the signal DOEN goes Low. If the node NDO has a High potential at this point in time, the node NDO is driven Low and the signal DO is reset to the High level in response to the output of the tristate inverter INT. On the other hand, if the node NDO has a Low potential, the signal DO remains High even when the signal DOEN goes Low.

As the differential amplifier SA is driven, the potential difference (e.g., Δ V) between the sense lines NSL, SL is amplified. At this time, as the sense line NSL is driven Low by the differential amplifier SA, the sense line SL having the High potential is discharged to a certain degree.

When the sense line NSL is driven Low, the transistor TDN turns ON. As a result, the output circuit 16 outputs the Low potential to the connector 15, and the global data line GDL is discharged to the Low potential level. Meanwhile, the word line WL, the signal PCL, and the signal SAE go Low, the local bit lines LBL_B, LBL_T and the sense lines NSL, SL are precharged to the High potential level, and the differential amplifier SA stops operating.

When the global data line GDL is driven Low, the node NDO comes to have a High potential in response to the output of the tristate inverter INT, because the signal DOEN is Low. Thus, the node NDO having the High potential causes the signal DO to go Low. As a result, data in Low state is output.

When the signal DO is stabilized at the Low level, the signals PCG and DOEN both go High. Also, when the signal PCG goes High, the global data line GDL is precharged to the High potential level.

Next, the operation of reading data in High state as shown in FIG. 2B will be described. The following description will be focused on the difference from FIG. 2A.

The local bit lines LBL_B, LBL_T and the sense lines NSL, SL stop being precharged, and the local bit line LBL_T is induced to have a potential gradually falling toward the Low level. Then, the potential of the local bit lines LBL_B, LBL_T is transferred to the sense lines NSL, SL.

When the differential amplifier SA is driven by a rise of the signal SAE to the High level, the potential difference Δ V between the sense lines NSL, SL is amplified.

At this time, as the sense line SL is driven Low by the differential amplifier SA, the sense line NSL having the High potential is discharged to a certain degree.

As a result, a High potential could be gradually output from the buffer BUF0 to the gate of the transistor TDN to turn the transistor TDN ON unintentionally, and a Low potential could be output from the output circuit 16 to the connector 15. However, since the sense line SL has the Low potential, the transistor TKN turns ON by receiving the High potential from the buffer BUF1. Thus, the gate of the transistor TDN does not have its potential raised to the High level, but maintains the Low level. Consequently, the Low potential is not output from the output circuit 16 to the connector 15. In this manner, the output circuit 17 may prevent the potential of the connector 15 and the global data line GDL from being affected by the Low potential supplied from the output circuit 16 and going Low.

The semiconductor memory device disclosed in Japanese Patent No. 5178182 is configured such that an inverter and a global bit line are connected to only one of a pair of local bit lines (see, for example, FIG. 1 of Japanese Patent No. 5178182). According to this configuration, in a situation where the local bit line to which the inverter and the global bit line are connected has a High potential, when that local bit line is discharged to the Low level by a differential amplifier, the global bit line could have a Low potential, although it should have a High potential. As a result, data could be read out erroneously.

In addition, according to a configuration using a single global bit line, when data in High state is read, for example, the output needs to be reset to the High level once by an output circuit, and the global bit line needs to be maintained at the High potential level. If the potential of the global bit line has fallen from the High level to the Low level, however, the drivability of the output circuit could deteriorate too much to reset the output normally.

Furthermore, since the inverter is connected to only one of the two nodes at which the differential amplifier is connected to the pair of local bit lines, the load capacities at those connection nodes are so imbalanced as to allow the differential amplifier to easily operate erroneously.

In contrast, according to this embodiment, in reading data in High state, in particular, even if the sense line NSL having the High potential is discharged from the High level by the differential amplifier SA so that a High potential is output to the gate of the transistor TDN, the output circuit 17 may still discharge the gate of the transistor TDN to the Low level.

Thus, since the transistor TDN is in OFF state and the Low potential is not output from the output circuit 16 to the connector 15, the global data line GDL may be maintained at the High potential level. As a result, data in High state may be read correctly.

In addition, according to this embodiment, the global data line GDL may be maintained at the High potential level when data in High state is being read, and the tristate inverter INT in the I/O circuit 30 may receive a High potential as expected. Thus, when the signal DOEN is activated, the output signal DO may be reset to the High level normally.

On top of that, since the output circuits 16, 17 are connected to the respective connection nodes between the sense lines NSL, SL and the differential amplifier SA, the load capacities at the respective connection nodes may be balanced easily.

As can be seen from the foregoing description, according to this embodiment, data in High state may be read correctly, and therefore, the chances of the semiconductor memory device 1 operating erroneously may be reduced. In addition, since the load capacities at the respective connection nodes between the differential amplifier SA and the sense lines NSL, SL may be balanced easily, the chances of the differential amplifier SA operating erroneously may be reduced more easily.

For example, by setting the gate sizes of the buffers BUF0, BUF1 to be equal to each other, the load capacities on the sense lines NSL, SL may be balanced easily. As a result, the sensitivity of the differential amplifier SA may be increased so much as to reduce the chances of the differential amplifier SA operating erroneously.

Note that the configuration of the I/O circuit 30 shown in FIG. 1 is only an example and the I/O circuit 30 may have any other configuration as long as the circuit 30 may reset the signal DO based on the potential level of the global data line GDL.

Also, the timings of level transitions on the respective lines and signals shown in the timing charts are only exemplary ones, and may be changed arbitrarily unless the change causes the semiconductor memory device 1 to operate erroneously. For example, the signal DOEN may go Low after the global data line GDL has been driven Low.

Second Embodiment

Figure 3:
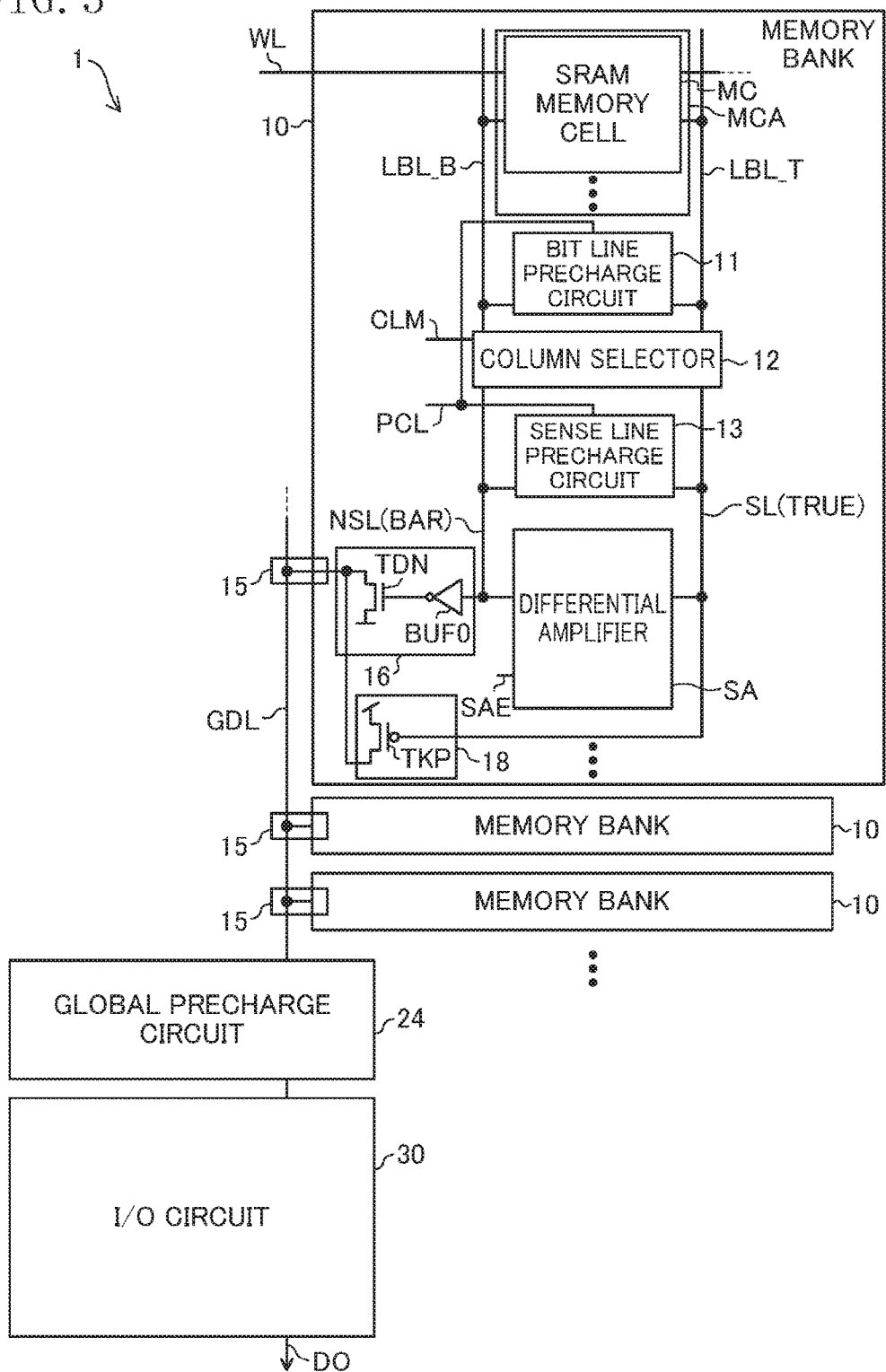
FIG. 3 illustrates a configuration for a semiconductor memory device according to a second embodiment.

FIG. 3 illustrates a configuration for a semiconductor memory device according to a second embodiment. In FIG. 3, the SRAM memory cells MC, the bit line precharge circuit 11, the column selector 12, the sense line precharge circuit 13, the differential amplifier SA, the global precharge circuit 24, and the I/O circuit 30 are illustrated as simple blocks, because they have the same configuration as their counterparts shown in FIG. 1.

The following description of this embodiment will be focused on the differences from the first embodiment. A second output circuit 18 included in each memory bank 10 according to this embodiment selectively outputs, according to the potential level of the sense line SL, a second potential (such as the voltage VDD) having High level as a second type of logic to the connector 15. Specifically, the output circuit 18 includes a Pch transistor TKP, one terminal of which is connected to the voltage VDD, another terminal of which is connected to the connector 15, and the gate of which receives the potential of the sense line SL.

The timing charts representing the operation of the semiconductor memory device 1 according to this embodiment are substantially the same as the ones illustrated in FIG. 2. However, the second output circuit 18 functions differently from the second output circuit 17 of the first embodiment described above.

Specifically, in reading data in High state, as the sense line SL is driven Low by the differential amplifier SA, the sense line NSL having the High potential is discharged to a certain degree.

As a result, a High potential is output from the buffer BUF0 to the gate of the transistor TDN to turn the transistor TDN ON unintentionally. Thus, a Low potential may be output gradually from the output circuit 16 to the connector 15.

On the other hand, since the sense line SL currently has a Low potential, the transistor TKP turns ON. Thus, a High potential is output from the output circuit 18 to the connector 15. That is to say, the output circuit 18 may function as a keeper circuit that keeps the potential level of the connector 15 and the potential level of the global data line GDL High when these potential levels should be High. In other words, the output circuit 18 may prevent the Low potential supplied from the output circuit 16 from driving the connector 15 and on the global data line GDL Low.

Thus, while data in High state is being read, the global data line GDL that should have a High potential may be maintained at the High potential level.

As can be seen, the same advantages as those of the first embodiment may be achieved according to this embodiment as well. In addition, the following advantages are also achieved according to this embodiment.

According to the configuration shown in FIG. 1 of Japanese Patent No. 5178182 cited above, if a plurality of transistors are connected to a global bit line, the leakage current flowing from those transistors during a read operation could gradually lower the potential level of the global bit line from the High level. As a result, if the output circuit determines the potential level of the global bit line to be Low, data could be read erroneously. The reason is that the conventional semiconductor memory device does not have the function of raising the potential of the global bit line, which becomes floating during the read operation, to the High level.

In contrast, according to this embodiment, even if the transistor TDN produces leakage current, the output circuit 18 may still maintain the connector 15 and the global data line GDL at the High potential level. That is to say, the output circuit 18 according to this embodiment may supply a High potential to the global data line GDL which becomes floating during the read operation, and therefore, an unwanted situation where data is read erroneously due to leakage current may be avoided.

In addition, since the number of elements that form the output circuit 18 decreases, the on-chip area and cost of the semiconductor memory device 1 may be cut down.

Note that according to this embodiment, if the gate size of the transistor TKP is set to be equal to the gate size of the buffer BUF0 functioning as an inverter (i.e., the overall gate size of the Nch and Pch transistors that form the buffer BUF0), the load capacities on the sense lines NSL, SL may be balanced easily. As a result, the sensitivity of the differential amplifier SA increases so much as to reduce the chances of the differential amplifier SA operating erroneously.

Third Embodiment

Figure 4:
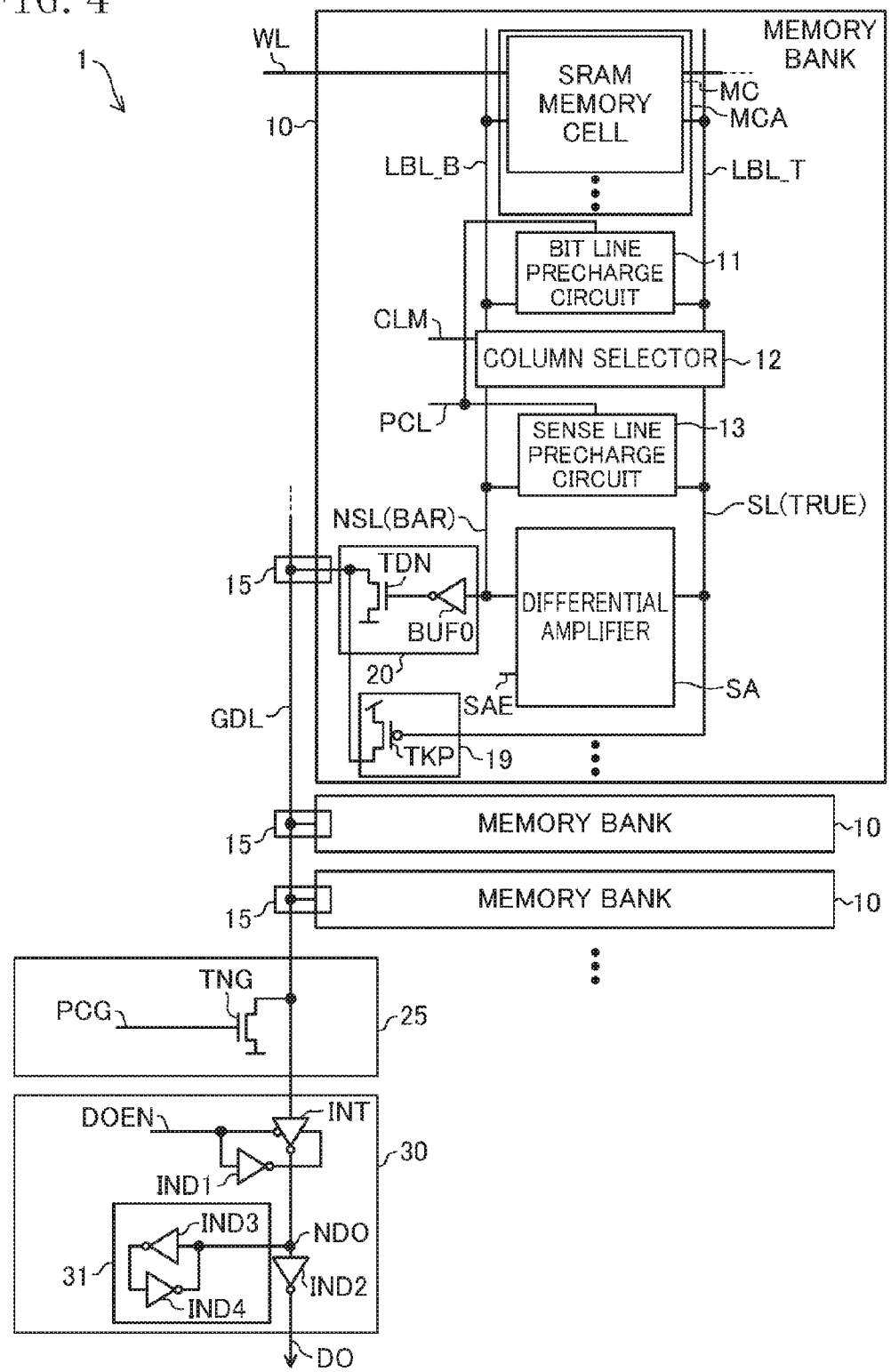
FIG. 4 illustrates a configuration for a semiconductor memory device according to a third embodiment.

FIG. 4 illustrates a configuration for a semiconductor memory device according to a third embodiment. The semiconductor memory device 1 of this embodiment further includes a predischarge circuit 25 which precharges the global data line GDL to a Low potential level (i.e., predischarges it), which is a major difference from the second embodiment. Thus, the following description of the third embodiment will be focused on the differences from the second embodiment.

In the memory bank 10 shown in FIG. 4, a first output circuit 19 selectively outputs a High potential to the connector 15 according to the potential level of the sense line SL. Specifically, the output circuit 19 includes a Pch transistor TKP, one terminal of which is connected to the voltage VDD, another terminal of which is connected to the connector 15, and the gate of which receives the potential of the sense line SL.

A second output circuit 20 selectively outputs a Low potential to the connector 15 according to the potential level of the sense line NSL. Specifically, the output circuit 20 includes a buffer BUF0 functioning as an inverter and an Nch transistor TDN. The buffer BUF0 has its input terminal connected to the sense line NSL and has its output terminal connected to the gate of the transistor TDN. The transistor TDN has one terminal thereof connected to the voltage VSS and another terminal thereof connected to the connector 15.

In this embodiment, the local bit line LBL_T and the sense line SL correspond to the first local bit line, and the local bit line LBL_B and the sense line NSL correspond to the second local bit line.

The predischarge circuit 25 is configured to supply a Low potential to the global data line GDL. Specifically, the predischarge circuit 25 includes an Nch transistor TNG, one terminal of which is connected to the voltage VSS, another terminal of which is connected to the global data line GDL, and the gate of which receives the signal PCG.

Next, it will be described with reference to FIG. 5 how the semiconductor memory device 1 of this embodiment performs a read operation.

FIG. 5 shows timing charts illustrating how the semiconductor memory device shown in FIG. 4 may perform a read operation in an exemplary embodiment. FIG. 5A illustrates how the device operates in reading data in Low state, and FIG. 5B illustrates how the device operates in reading data in High state. The following description will be focused on the difference between FIGS. 2 and 5.

First of all, since the signal PCG is High, the global data line GDL has been predischarged to a Low potential level.

In FIG. 5A, when the potential difference ΔV between the sense lines NSL, SL is amplified by the differential amplifier SA, the sense line NSL is driven Low, and the output circuit 20 starts outputting the Low potential to the connector 15. In addition, since the sense line NSL is driven Low by the differential amplifier SA, the sense line SL having the High potential is discharged to a certain degree. As a result, the High potential may be output gradually from the output circuit 19 to the connector 15. However, since the Low potential is output from the output circuit 20 to the connector 15, the connector 15 and the global data line GDL still have the Low potential. That is to say, the output circuit 20 may prevent the connector 15 from being affected by the output of the output circuit 19 and having the High potential.

Also, when the signal DOEN falls from the High level to the Low level, the global data line GDL has the Low potential. Thus, if the node NDO has maintained the Low potential, the node NDO is reset to the High potential level and the signal DO is reset to the Low potential level. On the other hand, if the node NDO has maintained the High potential, the node NDO still maintains the High potential, and the signal DO remains Low.

When the signal DO is stabilized at the Low level, data in Low state is read out. Meanwhile, the signal PCG goes High, and the global data line GDL is predischarged.

Next, the operation of reading data in High state will be described with reference to FIG. 5B. The following description will be focused on the difference between FIGS. 5A and 5B.

In FIG. 5B, when the potential difference ΔV between the sense lines NSL, SL is amplified by the differential amplifier SA, the sense line SL has the Low potential, and the output circuit 19 starts outputting a High potential to the connector 15. At this time, since the sense line NSL having the High potential is discharged to a certain degree, the output circuit 20 may gradually output a Low potential to the connector 15. However, since the High potential is output from the output circuit 19 to the connector 15, the global data line GDL is driven High.

At this point in time, the node NDO has been reset to the High potential level and the signal DO has been reset to the Low potential level. Thus, when the global data line GDL is driven High, the node NDO is driven Low, and the signal DO goes High. As a result, data in High state is read out.

As can be seen, according to this embodiment, the global data line GDL is predischarged during a read operation. Thus, in the output circuit 20 that outputs a Low potential to the connector 15, the transistor TDN may have a smaller gate size. That is to say, the output circuit 20 functioning as a keeper circuit that maintains the global data line GDL at the Low potential level may have its circuit area on the chip reduced.

Also, the output circuit 19 may be comprised of only a transistor TKP that selectively outputs a High potential to the global data line GDL according to the potential level of the sense line SL. Thus, the output circuit 19 may receive directly the output of the differential amplifier SA at the gate of the transistor TKP, and may drive the global data line GDL to the High potential level. As a result, the critical path leading from the memory bank 10 to the output terminal becomes a path leading from the transistor TKP of the output circuit 19 to the output terminal, and therefore, the number of stages of the transistors may be reduced on this path. Consequently, the read operation may be performed more speedily.

Optionally, according to this embodiment, the transistor TKP and the buffer BUF0 may have the same gate size. In that case, the load capacities of the sense lines NSL, SL may be balanced so much as to improve the sensitivity of the differential amplifier SA significantly.

Fourth Embodiment

Figure 6:
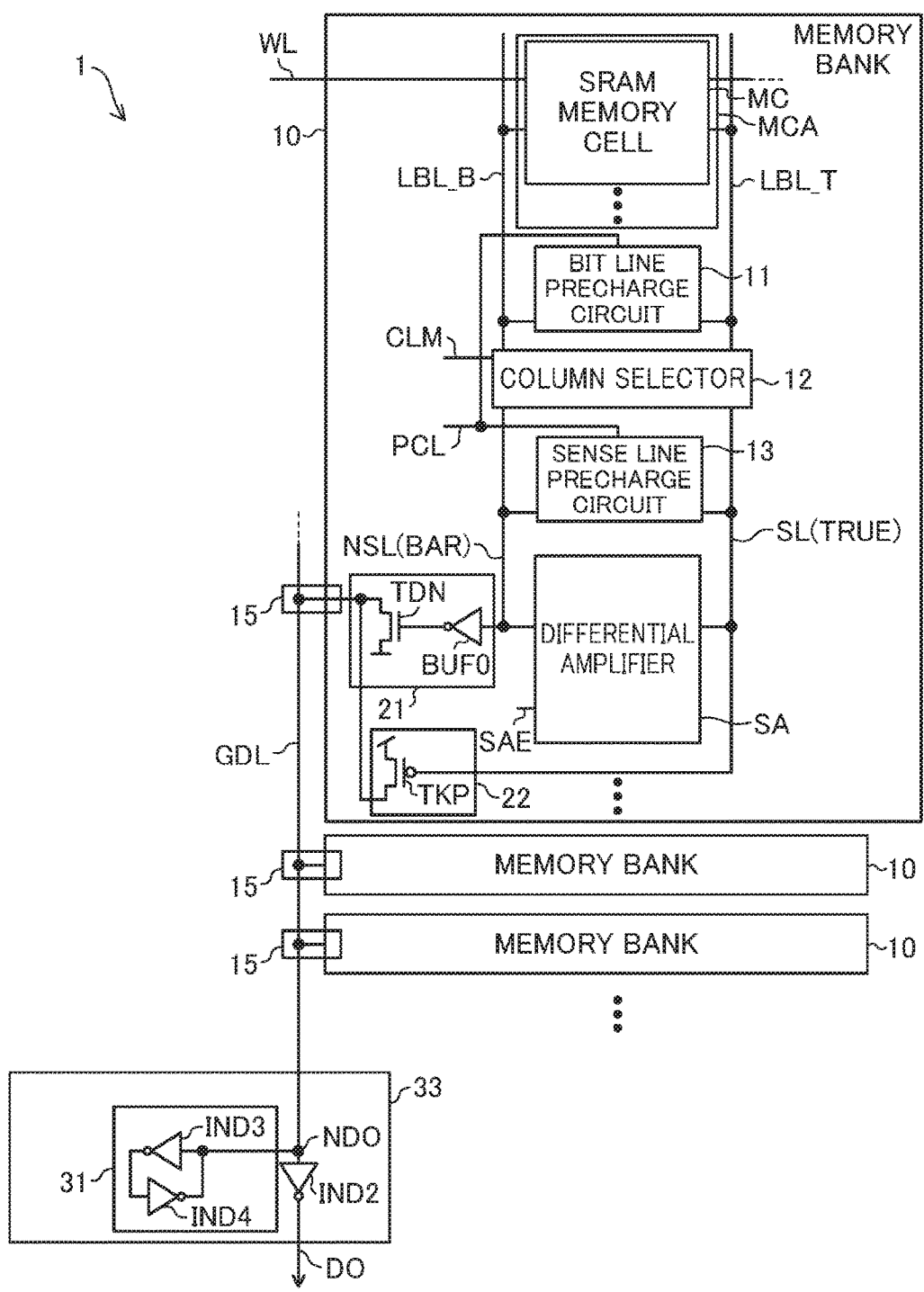
FIG. 6 illustrates a configuration for a semiconductor memory device according to a fourth embodiment.

FIG. 6 illustrates a configuration for a semiconductor memory device according to a fourth embodiment. The semiconductor memory device of this embodiment is configured to read data without precharging the global data line GDL. The following description of the fourth embodiment will be focused on the differences from the third embodiment.

A first output circuit 21 is configured to selectively output a Low potential to the connector 15 according to the potential level of the sense line NSL corresponding to the first local bit line. Specifically, the output circuit 21 includes a buffer BUF0 and an Nch transistor TDN. The buffer BUF0 has its input terminal connected to the sense line NSL and its output terminal connected to the gate of the transistor TDN. The transistor TDN has one terminal thereof connected to the voltage VSS and another terminal thereof connected to the connector 15.

A second output circuit 22 is configured to selectively output a High potential to the connector 15 according to the potential level of the sense line SL corresponding to the second local bit line. Specifically, the output circuit 22 includes a Pch transistor TKP, one terminal of which is connected to the voltage VDD, another terminal of which is connected to the connector 15, and the gate of which receives the potential of the sense line SL.

An I/O circuit 33 includes an inverter IND2 and a latch circuit 31.

In the semiconductor memory device 1 of this embodiment, there is no need to precharge the global data line GDL or reset the output data, and therefore, the signals PCG and DOEN shown in FIGS. 4 and 5 may be omitted.

Next, it will be described with reference to FIG. 7 how the semiconductor memory device 1 of this embodiment performs a read operation.

FIG. 7 shows timing charts illustrating how the semiconductor memory device shown in FIG. 6 may perform a read operation in an exemplary embodiment. FIG. 7A illustrates how the device operates in reading data in Low state, and FIG. 7B illustrates how the device operates in reading data in High state.

First of all, the operation of reading data in Low state shown in FIG. 7A will be described. The following description will be focused on the difference between FIGS. 5 and 7.

As data in Low state is read out from a memory cell MC, the potential level of the local bit line LBL_T gradually falls, and the falling potential is transferred to the sense line SL. On the other hand, the potential levels of the local bit line LBL_B and the sense line NSL remain High.

As the differential amplifier SA is driven, the potential difference Δ V between the sense lines NSL, SL is amplified. At this time, as the sense line SL is driven Low by the differential amplifier SA, the sense line NSL having the High potential is discharged to a certain degree.

Since the sense line NSL is discharged to a certain degree, a Low potential may be output gradually from the output circuit 21. However, since the output circuit 22 outputs a High potential through the sense line SL having the Low potential, the connector 15 and the global data line GDL are driven High.

When the global data line GDL is driven High, the signal DO goes Low, and data in Low state is output.

Next, the operation of reading data in High state will be described with reference to FIG. 7B. The following description will be focused on the difference between FIGS. 7A and 7B.

As data in High state is read out from a memory cell MC, the potential level of the local bit line LBL_B gradually falls, and the falling potential is transferred to the sense line NSL. On the other hand, the potentials of the local bit line LBL_T and the sense line SL remain High.

As the differential amplifier SA is driven, the potential difference Δ V between the sense lines NSL, SL is amplified. At this time, as the sense line NSL is driven Low by the differential amplifier SA, the sense line SL having the High potential is discharged to a certain degree.

Since the sense line SL is discharged to a certain degree, a High potential may be output gradually from the output circuit 22. However, since the output circuit 21 outputs a Low potential through the sense line NSL having the Low potential, the connector 15 and the global data line GDL are driven Low.

When the global data line GDL is driven Low, the signal DO goes High, and data in High state is output.

As can be seen, according to this embodiment, a High potential is selectively output from the output circuit 22 to the connector 15 and the global data line GDL according to the potential level of the sense line SL. On the other hand, a Low potential is selectively output from the output circuit 21 to the connector 15 and the global data line GDL according to the potential level of the sense line NSL. Since the global data line GDL is driven High and Low in this manner, no precharge circuit is needed anymore.

In addition, since there is no need to reset the signal DO, the I/O circuit 33 may have a simplified configuration. Thus, the circuit area of the semiconductor memory device 1 may be reduced on the chip.

Besides, since the signal DOEN is no longer needed, no timing margin needs to be left to activate the signal DOEN. As a result, the read operation may be performed more speedily.

Furthermore, since there is no need to precharge the global data line GDL or reset the signal DO, the power dissipated for these purposes may be saved. Consequently, the overall power consumption of the semiconductor memory device 1 may be cut down.

Fifth Embodiment

Figure 8:
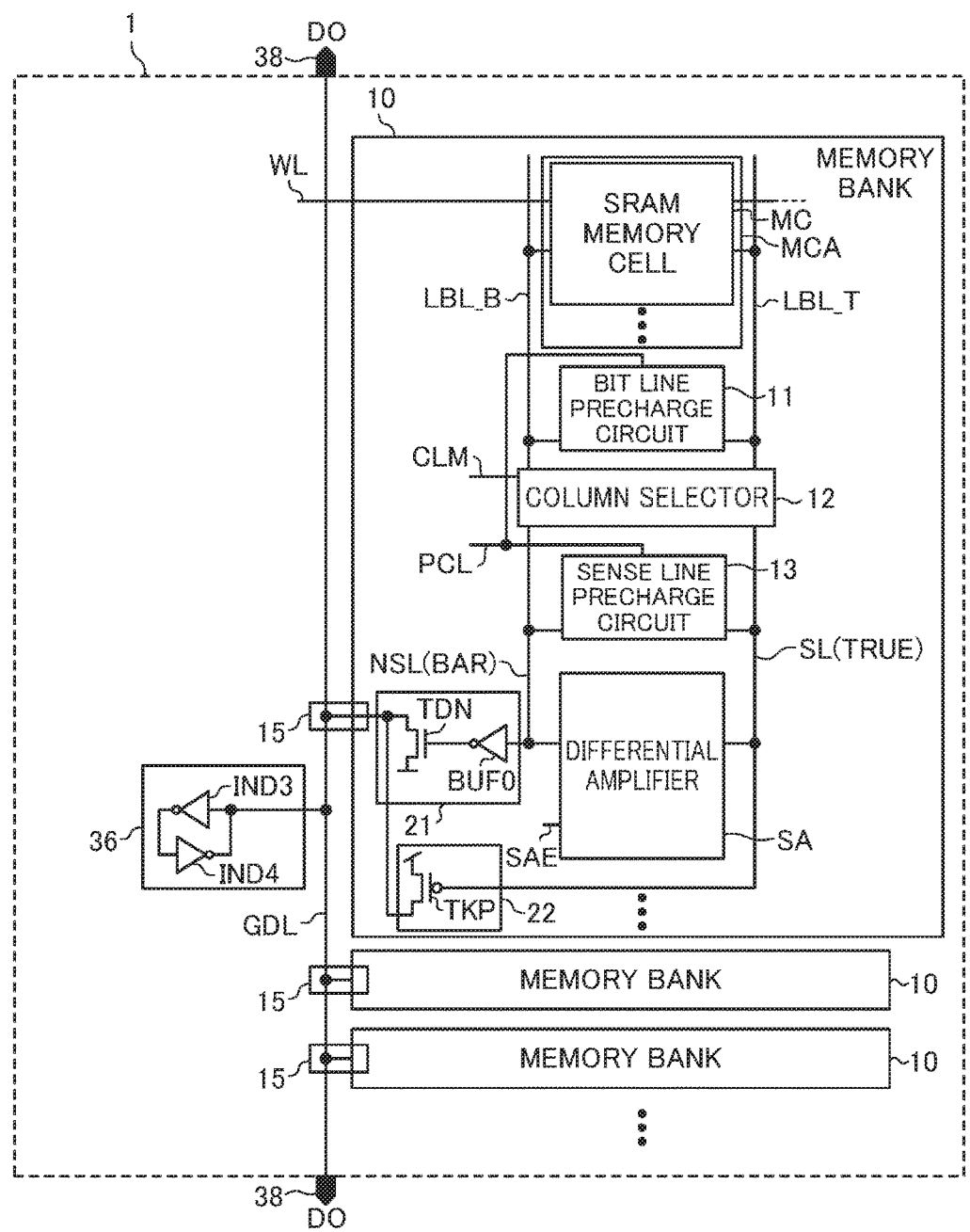
FIG. 8 illustrates a configuration for a semiconductor memory device according to a fifth embodiment.

FIG. 8 illustrates a configuration for a semiconductor memory device according to a fifth embodiment. The semiconductor memory device 1 of this embodiment is configured such that the global data line GDL may be connected directly to an output terminal 38 of the semiconductor memory device 1.

The following description of this embodiment will be focused on the difference from the fourth embodiment. The semiconductor memory device 1 of this embodiment includes a latch circuit 36 which maintains the global data line GDL at a constant potential level and the output terminal 38.

This semiconductor memory device 1 is configured such that the output terminal 38 may be connected directly to the global data line GDL and that the potential of the global data line GDL may be output as a signal DO.

According to this embodiment, no I/O circuit for buffering an output is needed, and therefore, the area to be assigned to the semiconductor memory device 1 on the chip may be reduced.

In addition, the number of stages of gates to be provided between the memory cell MC and the output terminal 38 may be reduced, and the read operation may be performed more speedily.

In addition, since the global data line GDL may be used as an output terminal for the semiconductor memory device 1, an external line may be connected to this semiconductor memory device 1 at an arbitrary point. Thus, a semiconductor device including this semiconductor memory device 1 may be designed more flexibly.

Furthermore, since the number of elements to be provided within the semiconductor memory device 1 decreases, not only the leakage current but also charge/discharge capacitance such as wiring capacitance may be reduced as well. As a result, the operating power may be cut down.

Sixth Embodiment

Figure 9:
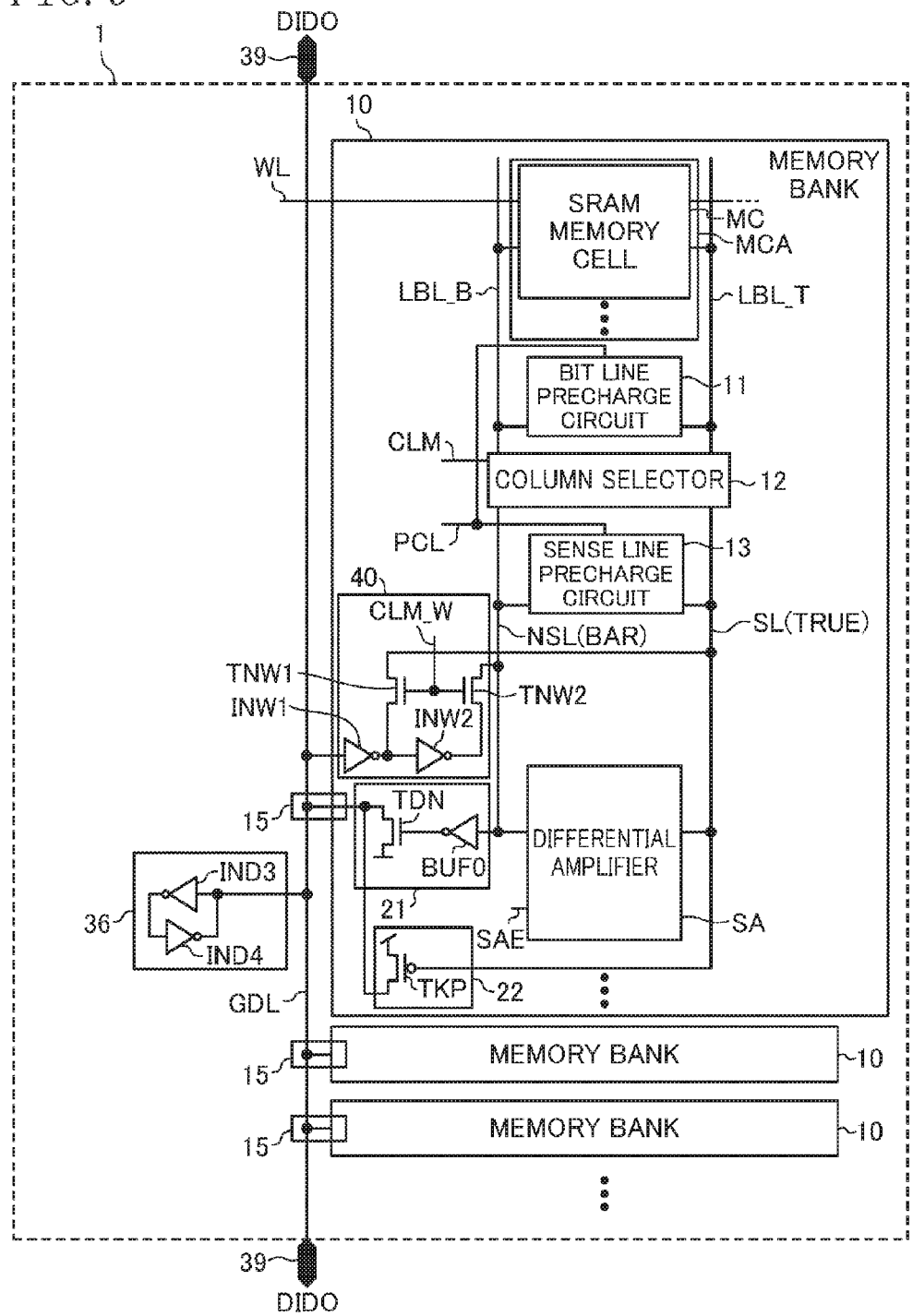
FIG. 9 illustrates a configuration for a semiconductor memory device according to a sixth embodiment.

FIG. 9 illustrates a configuration for a semiconductor memory device according to a sixth embodiment. The semiconductor memory device 1 of this embodiment is configured such that the global data line GDL may be connected directly to an input/output terminal 39 of the semiconductor memory device 1.

The following description of this embodiment will be focused on the difference from the fifth embodiment. The semiconductor memory device 1 of this embodiment includes the input/output terminal 39.

The memory bank 10 of this embodiment includes a write circuit 40 configured to write a signal DI, which is input data received at the input/output terminal 39, onto a memory cell MC through the global data line GDL.

The write circuit 40 is configured to output a signal with the same logic as the global data line GDL to the sense line NSL, and also output a signal with the inverted logic to the global data line GDL to the sense line SL, in response to a write control signal CLM_W.

Specifically, the write circuit 40 includes inverters INW1, INW2 and Nch transistors TNW1, TNW2.

The inverter INW1 has its input terminal connected to the global data line GDL and its output terminal connected to the input terminal of the inverter INW2.

The transistor TNW1 has one terminal thereof connected to the output terminal of the inverter INW1, and another terminal thereof connected to the sense line SL. The transistor TNW2 has one terminal thereof connected to the output terminal of the inverter INW2, and another terminal thereof connected to the sense line NSL. The signal CLM_W is input in common to the respective gates of these two transistors TNW1, TNW2.

When the signal CLM_W rises from the Low level to the High level, the write circuit 40 is ready to write data onto the memory cell MC.

That is to say, according to this embodiment, the single global data line GDL is used for both reading and writing data.

As can be seen, according to this embodiment, there is no need to provide any dedicated line for writing data, and therefore, the number of lines to provide, and eventually, the circuit area of the semiconductor memory device 1 on the chip, may be cut down. In addition, since no I/O circuit (see FIG. 1, for example) needs to be provided to input and output data, the semiconductor memory device 1 may have the configuration shown in FIG. 10.

Figure 10:
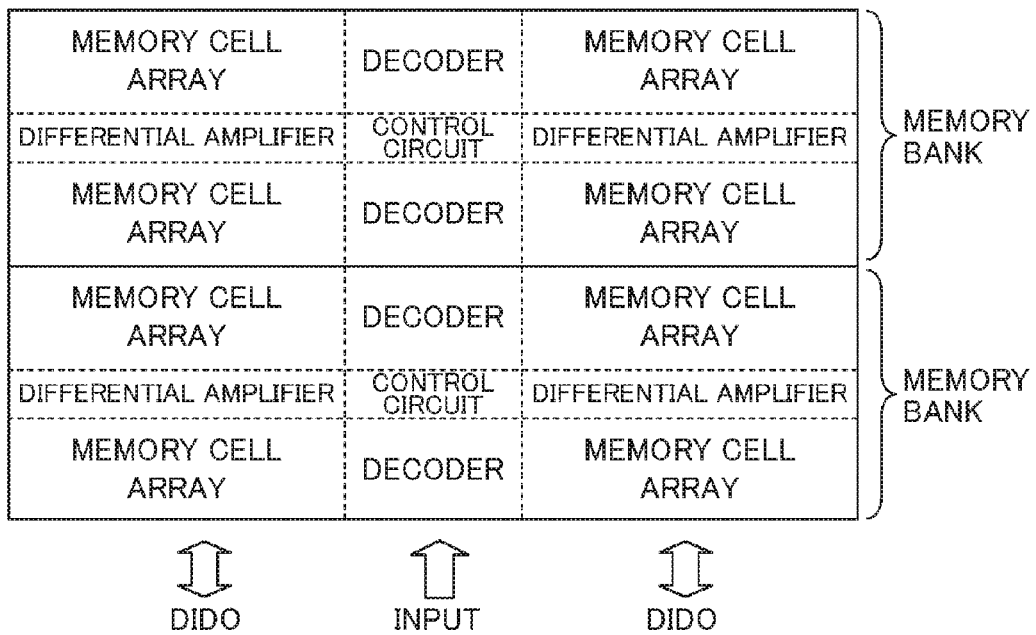
FIG. 10 illustrates diagrammatically the semiconductor memory device shown in FIG. 9.

FIG. 10 illustrates diagrammatically a semiconductor memory device according to this sixth embodiment. On the other hand, FIG. 11 illustrates diagrammatically a general semiconductor memory device as a reference example.

Figure 11:
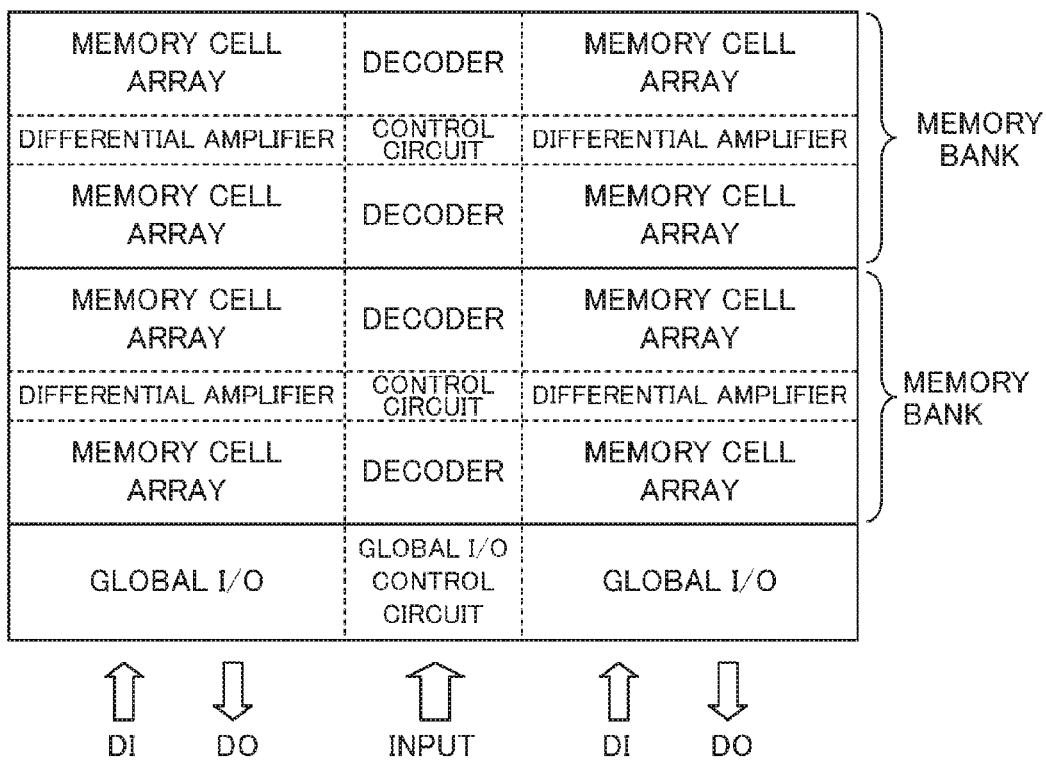
FIG. 11 illustrates diagrammatically a general semiconductor memory device.

As shown in FIG. 11, in the general semiconductor memory device, a write line (DI) and a read line (DO) are provided separately from each other, and a global I/O circuit is provided to connect the semiconductor memory device to an external device. Since various types of lines may be connected to the global I/O circuit, the connection between a memory bank and the global I/O circuit becomes complicated. Thus, if the semiconductor memory device having the configuration shown in FIG. 11 is adopted, it is difficult to design its layout such that a large number of memory banks are connected to increase the storage capacity.

On the other hand, the semiconductor memory device 1 shown in FIG. 10 does not need the global I/O circuit or its control circuit shown in FIG. 11, and therefore, may have its circuit area reduced on the chip.

In addition, the semiconductor memory device 1 needs no global I/O circuit and may read and write data by using the same global data line GDL in common for these two purposes. Thus, even if a large number of memory banks 10 need to be connected together, its layout may still be designed easily. As a result, the storage capacity may be increased readily.

A semiconductor memory device according to the present disclosure may prevent its differential amplifier from operating erroneously, may operate normally by avoiding generating data read errors, and therefore, contributes effectively to increasing the reliability of various types of electronic devices including an SRAM.

What is claimed is:

1. A semiconductor memory device comprising:
   a plurality of memory banks; and
   a single global data line provided for the plurality of memory banks, wherein
   each of the plurality of memory banks includes:
   a plurality of memory cells;
   first and second local bit lines forming a pair of local bit lines, to which the plurality of memory cells are connected and through which data is read from the plurality of memory cells;
   a differential amplifier connected to a first sense line and a second sense line and configured to amplify a potential difference between the first and second local bit lines;
   a first output circuit includes an inverter and a first transistor of a first channel conductivity type, an input of the inverter being connected to the first sense line, an output of the inverter being connected to a gate of the first transistor, one terminal of the first transistor being connected to a first potential, another terminal of the first transistor being directly connected to the global data line; and
   a second output circuit includes a second transistor of a second channel conductivity type opposite from the first channel conductivity type, one terminal of the second transistor being connected to a second potential different from the first potential, another terminal of the second transistor being directly connected to the global data line, a gate of the second transistor being connected to the second sense line.

2. The semiconductor memory device of claim 1, comprising a precharge circuit configured to precharge the global data line to the second potential.

3. The semiconductor memory device of claim 1, comprising a predischarge circuit configured to precharge the global data line to the first potential.

4. The semiconductor memory device of claim 1, wherein data is able to be written on the plurality of memory cells through the global data line.

5. The semiconductor memory device of claim 1, wherein the global data line is directly connectible to an input/output terminal of the semiconductor memory device.

\* \* \* \* \*